(12) United States Patent
Zhou et al.

(10) Patent No.: US 11,397,054 B2
(45) Date of Patent: Jul. 26, 2022

(54) HEAT DISSIPATION STRUCTURE

(71) Applicant: ASIA VITAL COMPONENTS (CHINA) CO., LTD., Shenzhen (CN)

(72) Inventors: Xiao-Xiang Zhou, Shenzhen (CN); Han-Min Liu, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 14 days.

(21) Appl. No.: 16/283,829

(22) Filed: Feb. 25, 2019

(65) Prior Publication Data

US 2020/0271389 A1   Aug. 27, 2020

(51) Int. Cl.
  *F28D 15/02*   (2006.01)
  *H01L 23/427*   (2006.01)
  *F28F 21/08*   (2006.01)

(52) U.S. Cl.
  CPC ............ *F28D 15/02* (2013.01); *F28F 21/084* (2013.01); *F28F 21/085* (2013.01); *H01L 23/427* (2013.01)

(58) Field of Classification Search
  CPC ........ F28D 15/02; F28D 15/04; F28D 15/046; F28D 15/0241; F28F 21/084; F28F 21/085; F28F 2255/02; H01L 23/427; H01L 23/4332
  See application file for complete search history.

(56) References Cited

U.S. PATENT DOCUMENTS 3,604,504 A  *  9/1971  Kessler, Jr. ........... F28D 15/046
                                                          165/46
2009/0071632 A1*  3/2009  Bryant ................ F28D 15/0241
                                                          165/104.26

FOREIGN PATENT DOCUMENTS

| CN | 104989868 A | 10/2015 |
| CN | 106229304 A | 12/2016 |
| JP | 1984060184 A | * 4/1984 |
| TW | 213191 | 9/1993 |
| TW | M577175 U | 4/2019 |

OTHER PUBLICATIONS

Search Report dated Jun. 29, 2019 issued by Taiwan Intellectual Property Office for counterpart application No. 108100539.
Search Report dated Jan. 14, 2020 issued by Taiwan Intellectual Property Office for counterpart application No. 108100539.

* cited by examiner

*Primary Examiner* — Harry E Arant
(74) *Attorney, Agent, or Firm* — Demian K. Jackson; Jackson IPG PLLC

(57) ABSTRACT

A heat dissipation structure includes a main body. The main body has an upper plate, a lower plate, an extensible portion and a chamber. The upper plate, the extensible portion and the lower plate together define the chamber. The extensible portion is disposed between the upper and lower plates. A main body capillary structure is disposed in the chamber. The main body capillary structure is disposed on an inner wall of the chamber. A working fluid is filled in the chamber.

7 Claims, 5 Drawing Sheets

HEAT DISSIPATION STRUCTURE

BACKGROUND OF THE INVENTION

1. Field of the Invention

The present invention relates generally to a heat dissipation structure, and more particularly to a heat dissipation structure, in which the main body is bendable and extensible to change the length (or height).

2. Description of the Related Art

The progress in semiconductor technology enables various integrated circuits (ICs) to have a gradually reduced volume. For the purpose of processing more data, the number of computing elements provided on the presently available ICs is several times higher than that on the conventional ICs of the same volume. When the number of computing elements on the ICs increases, the execution efficiency also increases and the heat generated by the computing elements during the operation thereof also increases. With an often seen central processing unit (CPU) taken as an example, when the CPU works at a full-load condition, the heat generated by the CPU is high enough to burn out the whole CPU. Therefore, it has become an important issue how to design a heat dissipation device for ICs.

The CPU, the chips and the other electronic components are all heat sources in the electronic device. When the electronic device operates, these heat sources will generate heat. Therefore, various heat dissipation structures such as heat pipes, vapor chambers, flat-plate heat pipes, etc. with good heat dissipation and conduction performance are used to conduct the heat or spread the heat. The heat pipe is mainly used for remote end heat conduction. One end of the heat pipe absorbs the heat to convert the internal working fluid from liquid phase to vapor phase so as to transfer the heat to the other end of the heat pipe and achieve the object of heat conduction. With respect to a part with larger heat transfer area, a vapor chamber is generally selected as the heat dissipation component. The vapor chamber mainly works in such a manner that a plane face of the vapor chamber in contact with the heat source absorbs the heat and the heat is transferred to the other face of the vapor chamber by the internal working fluid. Then the working fluid is condensed to dissipate the heat.

The conventional heat pipe or vapor chamber product has a fixed size (such as length). The heat sources of different electronic devices are arranged in different positions with different heights. Therefore, the heat pipe or vapor chamber mounted in a specific electronic device must have a size in adaptation to the position and height of the heat source of the electronic device so as to provide proper heat dissipation effect. As a result, the heat pipes or vapor chambers for different electronic devices cannot be commonly (or continuously) used. This is quite inconvenient in use of the heat pipe or vapor chamber.

SUMMARY OF THE INVENTION

It is therefore a primary object of the present invention to provide a heat dissipation structure having a main body with an extensible portion. The extensible portion can be extended or compressed to change the length (or height) of the main body and can be freely bent or deformed.

It is a further object of the present invention to provide a heat dissipation structure having a main body with an extensible portion. By means of the extensible portion, the use of the heat dissipation structure is diversified and the heat dissipation structure is applicable to different electronic devices so as to achieve commonness effect.

It is still a further object of the present invention to provide a heat dissipation structure having a main body with an extensible portion. By means of the extensible portion, the heat dissipation structure can be more conveniently used.

To achieve the above and other objects, the heat dissipation structure of the present invention includes a main body. The main body has an upper plate, a lower plate, an extensible portion and a chamber. The upper plate, the extensible portion and the lower plate together define the chamber. The extensible portion is disposed between the upper and lower plates. A main body capillary structure is disposed in the chamber. The main body capillary structure is disposed on an inner wall of the chamber. A working fluid is filled in the chamber.

According to the design of the heat dissipation structure of the present invention, the extensible portion can be extended or compressed to change the length (or height) of the main body and can be freely bent or deformed. Therefore, the use of the heat dissipation structure of the present invention is diversified and the heat dissipation structure of the present invention can be more conveniently used. Moreover, the heat dissipation structure of the present invention is applicable to different electronic devices to achieve commonness effect.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
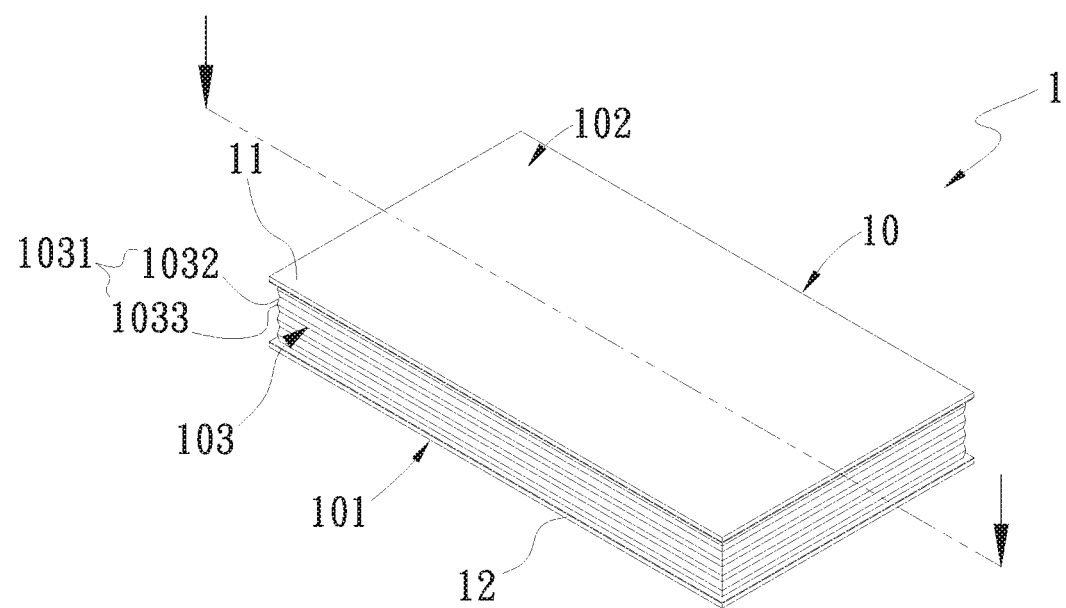
FIG. 1 is a perspective assembled view of a preferred embodiment of the heat dissipation structure of the present invention.
Figure 2A:
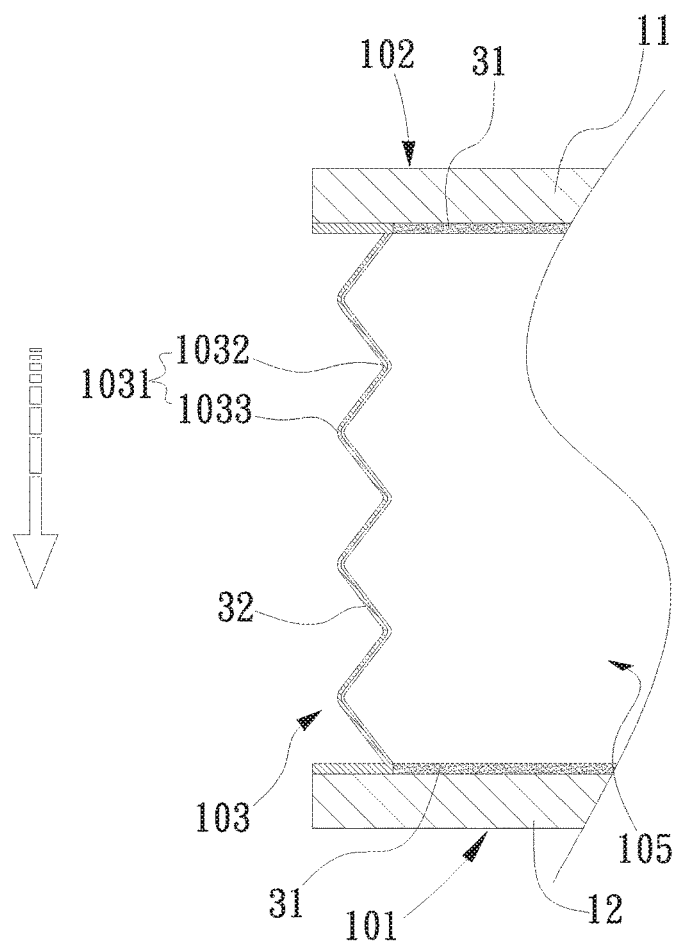
FIG. 2A is a partially sectional view of the preferred embodiment of the heat dissipation structure of the present invention, showing that the extensible portion of the main body is compressed to shorten the height.
Figure 2A:
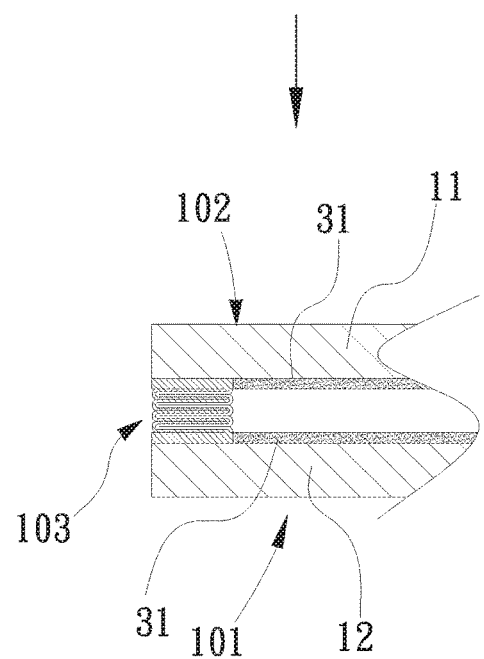
Figure 2B:
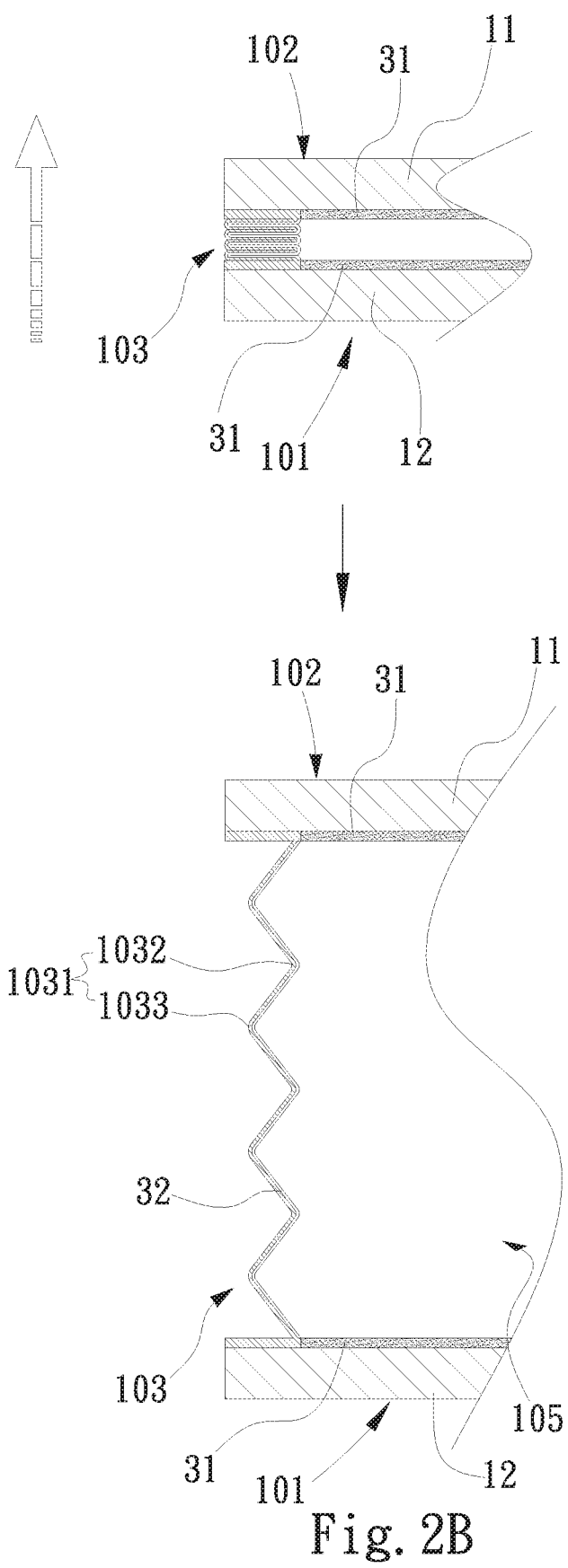
FIG. 2B is a partially sectional view of the preferred embodiment of the heat dissipation structure of the present invention, showing that the extensible portion of the main body is extended to increase the height.

Please refer to FIGS. 1, 2A and 2B. FIG. 1 is a perspective assembled view of a preferred embodiment of the heat dissipation structure of the present invention. FIG. 2A is a partially sectional view of the preferred embodiment of the heat dissipation structure of the present invention, showing that the extensible portion of the main body is compressed to shorten the height. FIG. 2B is a partially sectional view of the preferred embodiment of the heat dissipation structure of the present invention, showing that the extensible portion of the main body is extended to increase the height. According to the preferred embodiment, the heat dissipation structure 1 of the present invention includes a main body 10. In this embodiment, the main body 10 is, but not limited to, a vapor chamber. In practice, the main body 10 can be alternatively a heat plate, a heat pipe or any other two-phase fluid heat dissipation structure. The main body 10 has an upper plate 11, a lower plate 12, an evaporation section 101, a condensation section 102, an extensible portion 103 and a chamber 105. The upper and lower plates 11, 12 are made of a metal material selected from a group consisting of gold, silver, copper, iron, aluminum, stainless steel, titanium and an alloy thereof. The upper and lower plates 11, 12 and the extensible portion 103 together define the chamber 105. The evaporation section 101 and the condensation section 102 of the main body 10 are respectively positioned on the lower plate 12 and the upper plate 11. The evaporation section 101 is attached to a heat generation component such as a central processing unit, a graphics processing unit, a Northbridge/Southbridge chipset or any other heat source (not shown). The extensible portion 103 is made of a flexible and soft material with elasticity, such as a metal material selected from a group consisting of copper, gold, aluminum and an alloy thereof. The extensible section 103 is disposed between the upper and lower plates 11, 12 of the main body 10, (that is, between the evaporation section 101 and the condensation section 102 of the main body 10). In other words, the extensible section 103 is disposed between the upper and lower plates 11, 12 along a periphery of the main body 10. The extensible portion 103 integrally extends from an inner side of the upper plate 11 to an inner side of the lower plate 12 in adjacency to the periphery of the main body 10. In practice, the extensible portion 103 can be connected with the upper and lower plates 11, 12 by means of welding (such as laser welding, micro-arc welding, resistance welding or point welding) or diffusion bonding.

In a preferred embodiment, the upper and lower plates 11, 12 of the main body 10 are made of a metal material (selected from a group consisting of gold, silver, copper, iron, aluminum, stainless steel, titanium and an alloy thereof). The extensible portion 103 is made of a nonmetal material (such as flexible and soft plastic, rubber or polymer material with ductility and malleability). The extensible portion 103 and the upper and lower plates 11, 12 can be connected with each other to form the main body 10 by means of integral insert injection molding (or any other connection method such as adhesion, fitting or engagement).

The extensible portion 103 has multiple extensible sections 1031 each having an annular trough body 1032 and an annular crest body 1033. The annular trough body 1032 and annular crest body 1033 form one extensible section 1031. In this embodiment, there are three extensible sections 1031 for illustration purposes. The annular trough bodies 1032 and annular crest bodies 1033 of the extensible sections 1031 are alternately arranged and connected with each other to form the extensible sections 1031. The extensible sections 1031 can be axially extended to increase the length (or height) and freely bent or deformed or axially compressed to shorten the length (or height). In addition, the annular trough bodies 1032 have the same inner diameter and the annular crest bodies 1033 also have the same inner diameter. The number of the extensible sections 1031 is not limited to three. In practice, the number of the extensible sections 1031 can be adjusted in accordance with the length (or height) of the main body 10 and heat dissipation requirement. For example, the number of the extensible sections 1031 can be less than three (such as two extensible sections 1031) or more than four (such as four extensible sections 1031).

The evaporation section 101, the extensible portion 103 and the condensation section 102 together define the chamber 105. A working fluid (such as pure water, methanol or coolant) is filled in the chamber 105. A main body capillary structure 31 and a coating 32 extensible with the extensible portion 103 are disposed in the chamber 105. The main body capillary structure 31 is selected from a group consisting of metal sintered powder body, woven mesh, fiber body, channeled body and any composition thereof. The main body capillary structure 31 is disposed on an inner wall of the chamber 105. In this embodiment, the main body capillary structure 31 is a metal sintered powder body formed on the inner wall of the chamber 105 at the evaporation section 101 and the condensation section 102, (that is, on the inner sides of the upper and lower plates 11, 12). In this embodiment, there is one extensible portion 103 disposed between the upper and lower plates 11, 12. However, the number of the extensible portion 103 is not limited. In practice, alternatively, two or more than two extensible portions 103 can be disposed between the upper and lower plates 11, 12 at intervals. Therefore, the use of the present invention is diversified.

In this embodiment, the coating 32 is a capillary structure such as a woven mesh, a fiber body or a channeled body. The coating 32 is disposed in the chamber 105 between the upper and lower plates 11, 12 corresponding to the extensible portion 103. In addition, the coating 32 is in contact and connection with the main body capillary structure 31 in the chamber 105. That is, the coating 32 is disposed on the inner wall of the chamber 105 corresponding to the extensible portion 103 (the coating 32 is formed and disposed on the inner wall of the extensible portion 103 in the chamber 105) and positioned between the upper and lower plates 11, 12. One end of the coating 32 is in contact with the main body capillary structure 31 disposed on the inner wall of the chamber 105 in adjacency to the upper plate 11. The other end of the coating 32 is in contact with the main body capillary structure 31 disposed on the inner wall of the chamber 105 in adjacency to the lower plate 12. In a preferred embodiment, the coating 32 is selected from a group consisting of woven mesh, fiber body, a composition of woven mesh and whisker and a composition of fiber body and whisker.

Figure 3A:
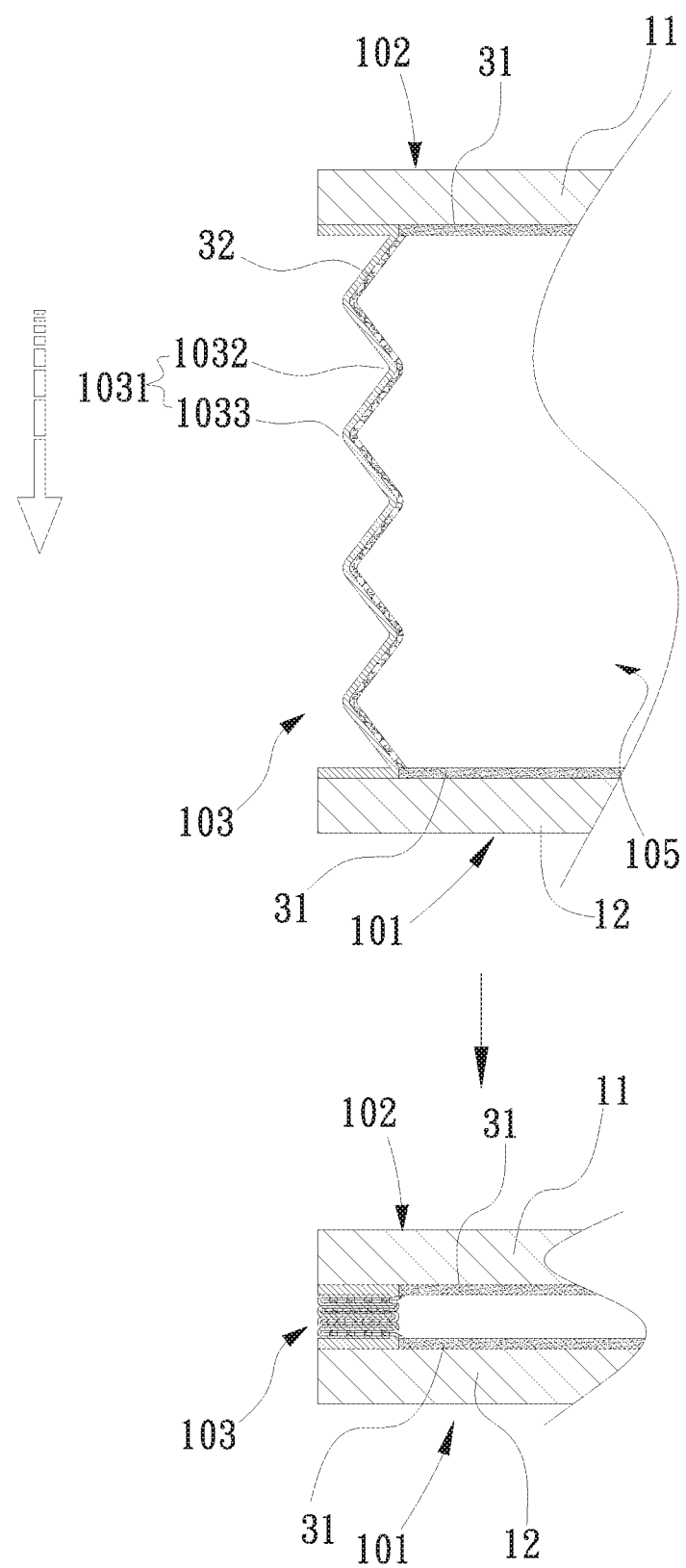
FIG. 3A is a partially sectional view of another embodiment of the heat dissipation structure of the present invention, showing that the extensible portion of the main body is compressed to shorten the height.
Figure 3B:
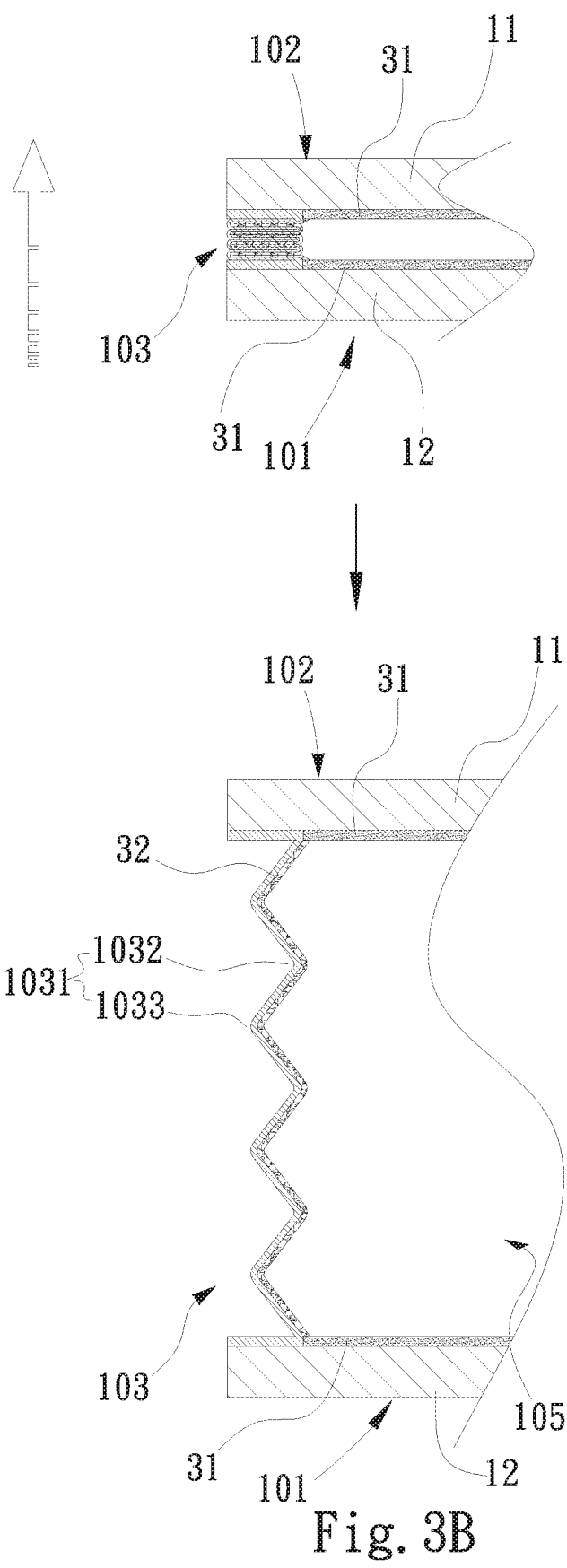
FIG. 3B is a partially sectional view of the other embodiment of the heat dissipation structure of the present invention, showing that the extensible portion of the main body is extended to increase the height.

Please now refer to FIGS. 3A and 3B. FIG. 3A is a partially sectional view of another embodiment of the heat dissipation structure of the present invention, showing that the extensible portion of the main body is compressed to shorten the height. FIG. 3B is a partially sectional view of the other embodiment of the heat dissipation structure of the present invention, showing that the extensible portion of the main body is extended to increase the height. In this embodiment, the coating 32 is not a capillary structure as aforesaid. That is, the coating 32 is alternatively a structure made of a flexible and soft polymer material (such as polyester fiber or nylon fiber) or a structure made of a flexible and soft paper material (such as fiber paper) or a structure made of a flexible and soft fabric material (such as unwoven fabric or cotton fabric) or a memory alloy (such as titanium-nickel alloy, titanium-palladium alloy or titanium-nickel-copper alloy). The coating 32 is disposed in the chamber 105 in adjacency to the corresponding extensible portion. That is, the coating 32 is coated on the inner side of the extensible portion 103 in the chamber 105. Two ends of the coating 32 are respectively in contact and connection with the main body capillary structure 31 disposed on the inner wall of the chamber 105 in adjacency to the upper and lower plates 11, 12. The fiber of the coating 32 itself can provide capillary attraction (such as the capillary attraction of the fiber of the unwoven fabric) to absorb the condensed working fluid from the main body capillary structure 31 on the inner side of the upper plate 11 in the chamber 105. Then the fiber of the coating 32 transfers the working fluid to the main body capillary structure 31 on the inner side of the lower plate 12 in the chamber 105. Moreover, by means of the coating 32, the extensibility and elasticity of the extensible portion 103 can be enhanced. Also, the strength and flexibility of the extensible portion 103 can be increased.

Accordingly, the evaporation section 101 of the main body 10 is attached to a heat generation component (such as a central processing unit) of an electronic device such as a notebook, a computer, a communication chassis, a server, an intelligent mobile phone, a communication apparatus, an industrial device or a transportation device (not shown). By means of axially extending the extensible portion 103 to increase the height (as shown in FIG. 2B), the condensation section 102 of the main body 10 is axially lifted to a higher position in the electronic device without heat source to dissipate the heat. When the condensation section 102 is lifted to the area without heat source, in case the condensation section 102 is hindered by other electronic components, due to the flexibility and elasticity and softness of the material of the extensible portion 103, the extensible portion 103 can be freely bent to bypass the obstacle of the other electronic component. Reversely, when it is desired to shorten the height of the main body 10 and lower the condensation section 102 to an area with less heat source, the extensible portion 103 is axially compressed to shorten the height of the main body 10 (as shown in FIG. 2A). Therefore, the condensation section 102 of the main body 10 is axially lowered to a position in the electronic device with less heat source to dissipate the heat. Accordingly, the extensible portion 103 is extensible and compressible to change the height (or length) of the main body 10. Also, the extensible portion 103 can be bent so that the use of the present invention is diversified to achieve convenience in use of the present invention.

In addition, when the main body 10 is removed from an electronic device to another electronic device with a different size and mounted therein, the extensible portion 103 of the main body 10 can be extended or compressed to change the height (or length) of the main body 10 and can be freely bent in adaptation to the different size of the other electronic device. Therefore, the main body 10 is applicable to the other electronic device and can be used in common.

In conclusion, according to the design of the heat dissipation structure 1 of the present invention, the extensible portion can be extended or compressed to change the length of the main body and can be freely bent. Therefore, the use of the heat dissipation structure 1 of the present invention is diversified to achieve convenience in use of the heat dissipation structure 1 of the present invention. Moreover, the heat dissipation structure 1 of the present invention is applicable to different electronic devices to achieve commonness effect.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat dissipation structure comprising:
    a main body having a planar upper plate, a condensation section positioned on the planar upper plate, a planar lower plate, an evaporation section positioned on the planar lower plate, and an extensible portion having multiple planar extensible sections disposed between and connected directly to the upper and the lower planar plates so as to together define a chamber configured to be extended or compressed to increase or reduce a height of the main body and wherein, when the extensible portion is compressed to a smallest height of the main body, planar surfaces of each extensible section are in contact with planar surfaces of adjacent other extensible sections with alternating inward and outward bending of the plurality of extensible sections,
    a main body capillary structure disposed on an inner surface of the planar upper and lower plates,
    a working fluid filled in the chamber, and
    a coating formed and disposed on an inner surface of the extensible portion and extending from an upper end to a lower end of the extensible portion, one end of the coating being in contact and connected with the main body capillary structure disposed on the upper planar plate, an opposite end of the coating being in contact and connected with the main body capillary structure disposed on the lower planar plate.

2. The heat dissipation structure as claimed in claim 1, multiple extensible sections each having an annular trough body and an annular crest body forming one extensible section, the annular trough bodies and the annular crest bodies of the extensible sections being alternately arranged and connected with each other to form the extensible sections.

3. The heat dissipation structure as claimed in claim 1, wherein the main body capillary structure is selected from a group consisting of woven mesh, fiber body, metal sintered powder body, channeled body and any composition thereof, the coating being a capillary structure.

4. The heat dissipation structure as claimed in claim 1, wherein the coating is a structure selected from a group consisting of flexible and soft polymer material structure, flexible and soft paper structure, flexible and soft fabric structure and a memory alloy structure.

5. The heat dissipation structure as claimed in claim 1, wherein the main body is a vapor chamber or a heat plate.

6. The heat dissipation structure as claimed in claim 1, wherein the upper and lower planar plates are made of a metal material selected from a group consisting of copper, gold, and aluminum.

7. The heat dissipation structure as claimed in claim 1, wherein the coating is a capillary structure selected from a group consisting of channeled body, woven mesh, and fiber body.

* * * * *